INVENTORS
SENJI SHOHJI
KAZUO KOBAYASHI
MASANOBU KUWATA
YUTAKA WATANABE
TADAMASA HIRAI

BY Paul K. Craig, Jr.
ATTORNEY

INVENTORS
SENJI SHOHJI
KAZUO KOBAYASHI
MASANOBU KUWATA
YUTAKA WATANABE
TADAMASA HIRAI
BY
Paul M. Craig, Jr.
ATTORNEY INVENTORS
SENJI SHOHJI
KAZUO KOBAYASHI
MASANOBU KUWATA
YUTAKA WATANABE
TADAMASA HIRAI BY Paul M. Craig, Jr.
ATTORNEY INVENTORS
SENJI SHOHJI
KAZUO KOBAYASHI
MASANOBU KUWATA
YUTAKA WATANABE
TADAMASA HIRAI BY Paul M. Craig, Jr.
ATTORNEY

United States Patent Office 3,474,301

Patented Oct. 21, 1969

3,474,301

SEMICONDUCTOR DEVICES HAVING INSULATING PROTECTIVE FILMS AND SEALED WITH RESINOUS MATERIALS

Senji Shohji, Kodaira-shi, Kazuo Kobayashi and Masanobu Kuwata, Tokyo, Yutaka Watanabe, Hitachi-shi, and Tadamasa Hirai, Tokyo, Japan, assignors to Hitachi, Ltd., Tokyo, Japan, a corporation of Japan Filed Apr. 21, 1966, Ser. No. 544,150

Claims priority, application Japan, Apr. 30, 1965, 40/25,106

Int. Cl. H01l 3/00, 5/00

U.S. Cl. 317—234 15 Claims

ABSTRACT OF THE DISCLOSURE

A semiconductor device comprising a silicon substrate having at least one PN junction extending to a surface of the substrate, a silicon oxide layer formed on the surface of the substrate, and resinous material covering the silicon oxide layer and including at least one oxide of Pb, Mo or V to improve the stability of electric characteristics of said device.

The present invention relates to semiconductor devices which are protected or sealed with plastic or resinous materials.

In general, the electrical characteristics of semiconductor devices having the semiconductor surfaces exposed to the ambient atmosphere will deteriorate with the lapse of time due to such factors as moisture or the ions of impurities. Such secular deterioration of the electrical characteristics has been prevented by housing the semiconductor substrates in hermetically sealed metal cans so that the surfaces of the semiconductor bodies may be shielded from the effects of the ambient atmosphere.

On the other hand, efforts were directed to the reduction of the size, the weight and the cost of semiconductor devices by effecting integral molding of a semiconductor substrate together with the leads with a plastic material. The molding material includes epoxy resin, polyester, resin, silicone resin and so forth, of which epoxy resin has been most widely used because of its very limited shrinking factor.

In view of the hygroscopicity and/or air permeability which are inherent to these resins, it has been impossible to effect perfect shielding of the surfaces of semiconductor devices from the ambient atmosphere and this fact has constituted one of the factors responsible for the reduction of reliability of semiconductor devices.

Recently, however, the technique of protecting the surfaces of the semiconductor bodies with a film of oxide such as silicon dioxide, and further the technique of coating the dioxide film surfaces with a layer of glass have been developed, and these techniques have contributed to an enhancement of the poor reliability of the conventional semiconductor devices which had been produced by the procedure of molding with a resinous material. Neverthless, the degree of the enhancement of the reliability was not such a satisfactory one so that efforts have been given to further improve the molding materials and the molding structure.

It is, therefore, the primary object of the present invention to further enhance the reliability as well as to increase the maximum power dissipation of the semiconductor devices which are sealed or coated with plastic or resinous materials.

As a result of the studies conducted by the inventors, it has been found that the reliability of the semiconductor devices can be enhanced greatly by the use of the foregoing resinous materials mixed with a certain other material or applying such material onto the insulating oxide film covering the semiconductor bodies. This certain other material may be any one of the lead oxides including $Pb_3O_4$, or molybdenum oxides or vanadium oxides, or may be any two or more combinations of these materials. These various kinds of material will be hereinafter referred to simply as the $Pb_3O_4$ group material for the sake of convenience. Of the aforesaid groups of material, $Pb_3O_4$ is one of those materials which has been used either by being applied to the surface of the elements or by being contained in the materials enveloping the circuit elements such as the germanium transistors which, per se, have no stable protection films formed superficially thereof which would stabilize the initial operating values of such transistors. However, $Pb_3O_4$ is a substance which is preferably not contained in the envelopes if a long-duration stability of reliability of the circuit elements per se is to be sought. In other words, $Pb_3O_4$ is a substance which has been considered to be not at all contributory to the enhancement of the reliability of the elements. The inventors have succeeded, however, in enhancing the reliability of semiconductor devices by applying the mixture of said $Pb_3O_4$ and said thermo-setting resin to semiconductor devices which are coated with an insulating oxide such as silicon dioxide. The present invention will be described hereunder by referring to the accompanying drawings, wherein:

FIG. 1 is a perspective view of the transistor of one embodiment of the present invention with part represented in section;

FIGS. 2*a* and 2*b*, FIG. 3 and FIG. 4 are graphs showing the characteristics of the transistors of various embodiments of the present invention.

Figure 1:
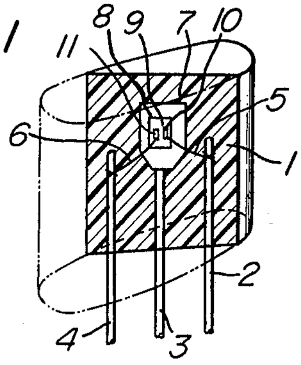
Figure 5:
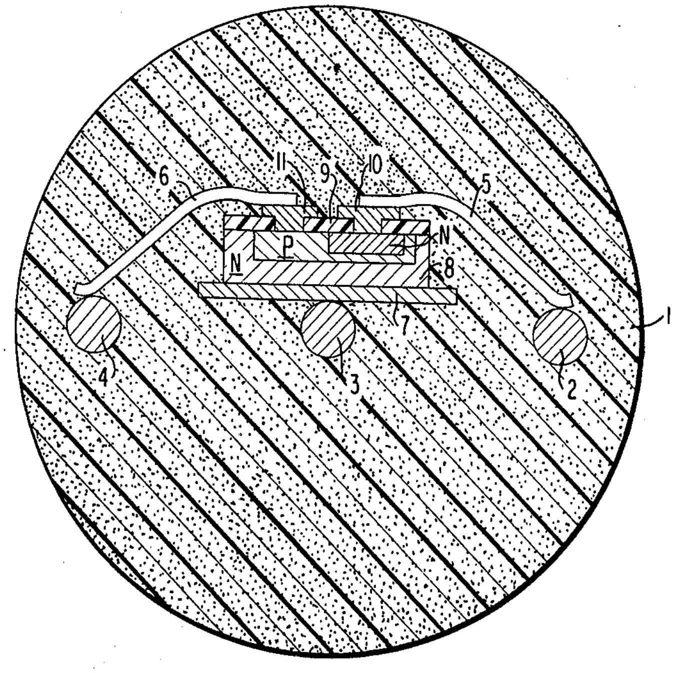
FIG. 5 is a cross-sectional view taken along line V—V of FIG. 1.

In the drawings, FIG. 1 and FIG. 5 show a transistor structure embodying the present invention, wherein reference numeral 1 represents a resinous body; numeral 2 represents a base lead; numeral 3 represents a collector lead; numeral 4 represents an emitter lead; numeral 5 represents a base connector lead; numeral 6 represents an emitter connector lead; numeral 7 represents a substrate to which semiconductor elements are attached; numeral 8 represents a semiconductor body of a transistor which is represented as an NPN type transistor in this embodiment; numeral 9 represents an insulating dielectric layer e.g. silicon oxide layer; numerals 10 and 11 represent an emitter and a base electrode, respectively, and numeral 12 represents a coating including an oxide of a metal.

The surface of the semiconductor body 8 of the transistor is covered with a rigid and stable insulating dielectric layer 9 which protects the portion if the PN junction reaching the aforesaid surface of the semiconductor body 8, said PN junction being formed within said semiconductor body 8. The dielectric layer 9 generally used in silicon planar type transistors is comprised of a silicon dioxide layer formed by oxidizing the surface of the silicon substrate 8. Other dielectric layers which are also used include a layer of silicon dioxide deposited on the surface of the semiconductor body 8 by effecting pyrolysis of organo-oxy-silane and also include the layers formed by vitrifying the silicon dioxide surface with a material such as lead oxide.

Now, the resinous body 1 will be described in further detail. The composition of the conventional resinous body 1 is shown in the following Table 1. The percentages given in the table represent weight percent.

Table 1

| | Percent |
|---|---|
| (1) Epoxy resin | 26 |
| (2) Methyl-3,6-endomethylene-$\Delta^4$ - tetrahydrophthalic anhydride | 22 |
| (3) Silica ($SiO_2$) | 47 |
| (4) Coloring agent and hardening promoting agent | 5 |

The aforesaid epoxy resin is a thermo-setting resin which has been used as the so-called base resin. The resinous body 1 may be comprised of other silicone group resins.

Methyl-3,6-endomethylene-$\Delta^4$ - tetrahydrophthalic anhydride is hardening agent of the acid anhydride group. The hardening agent of resin may be comprised of other types of acid anhydride group such phthalic acid anhydride. Silica is a filler which has been used to suppress the hygroscopicity.

One embodiment of the present invention is represented by the resinous body 1 of the composition of said Table 1 to which a $Pb_3O_4$ group material is mixed. This embodiment of the present invention will be described in detail on the individual resinous bodes containing $Pb_3O_4$ in different volumes.

First, description will be made, by referring to FIG. 2, on the electrical characteristics of the semiconductor devices wherein the contents of $Pb_3O_4$ in the resinous bodies 1 of the aforesaid composition are 1%, 5%, and 10% by volume, respectively, of the resinous bodies.

Figure 2A:
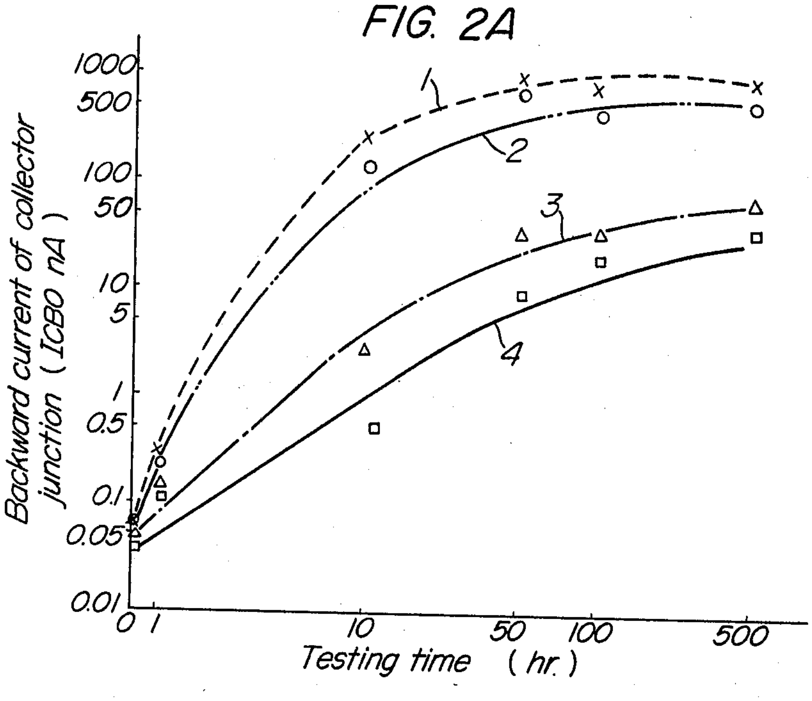
Figure 2B:
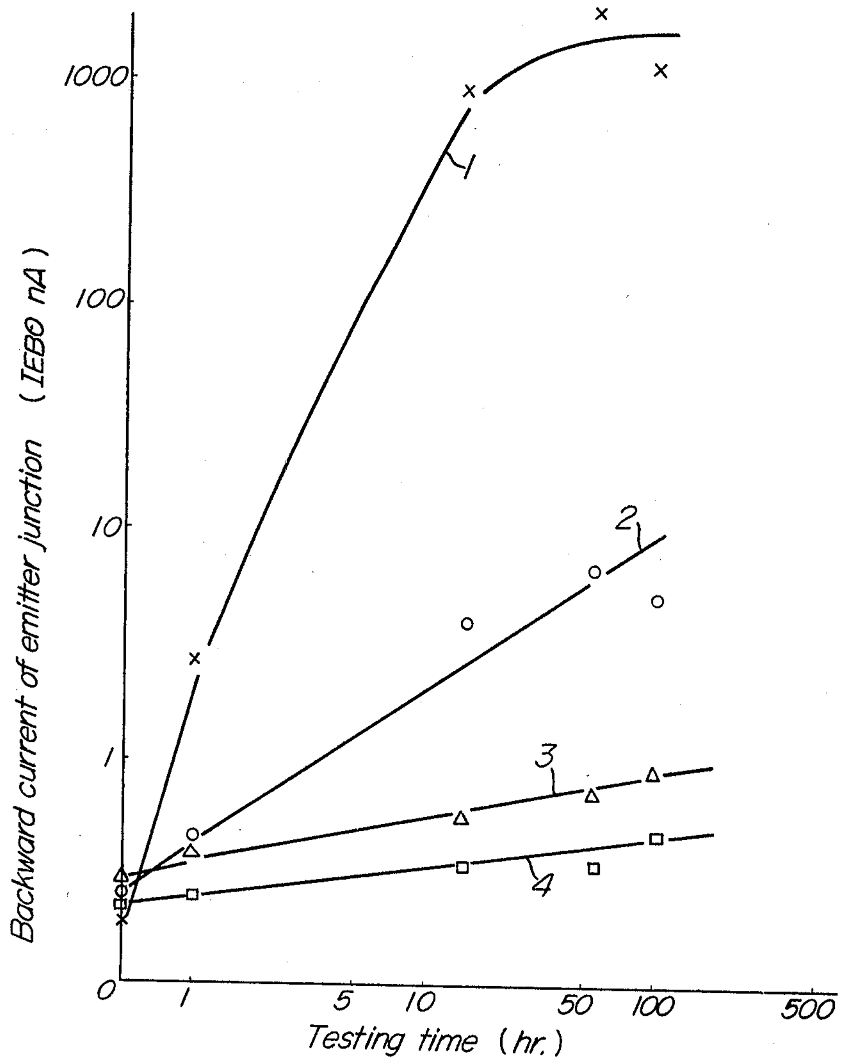

FIGS. 2*a* and 2*b* shows the secular changes in the backward current of the collector junction $I_{CBO}$ (or the saturation current between collector and base) and in the backward current of the emitter junction $I_{EBO}$ (or the saturation current between base and emitter) respectively, of the transistors molded with the resinous bodies 1 of the aforementioned composition but containing $Pb_3O_4$ in different amounts. The values shown in the graphs represent the mean values of the twenty test-transistors to which electric power was supplied continuously so as to always maintain the respective junction temperatures at or in the vicinity of 175° C. which the premissible upper limit temperature when the silicon transistors were placed in operation, besides the values of the occasions where said $I_{CBO}$ and $I_{EBO}$ were read. In FIGS. 2*a* and 2*b*, line 1 denotes the changes where the $Pb_3O_4$ content in the resinous body 1 was 0%; line 2 denotes the changes where said content was 1%; line 3 denotes the changes where the content was 5%; and line 4 denotes the changes where the contact was 10%. As is clear from these graphs, more stabilized characteristics of the secular changes in $I_{CBO}$ and $I_{EBO}$ were observed in the resinous bodies having a greater content of $Pb_3O_4$, and furthermore, both $I_{CBO}$ and $I_{EBO}$ were noted to be maintained at low levels.

Figure 3:
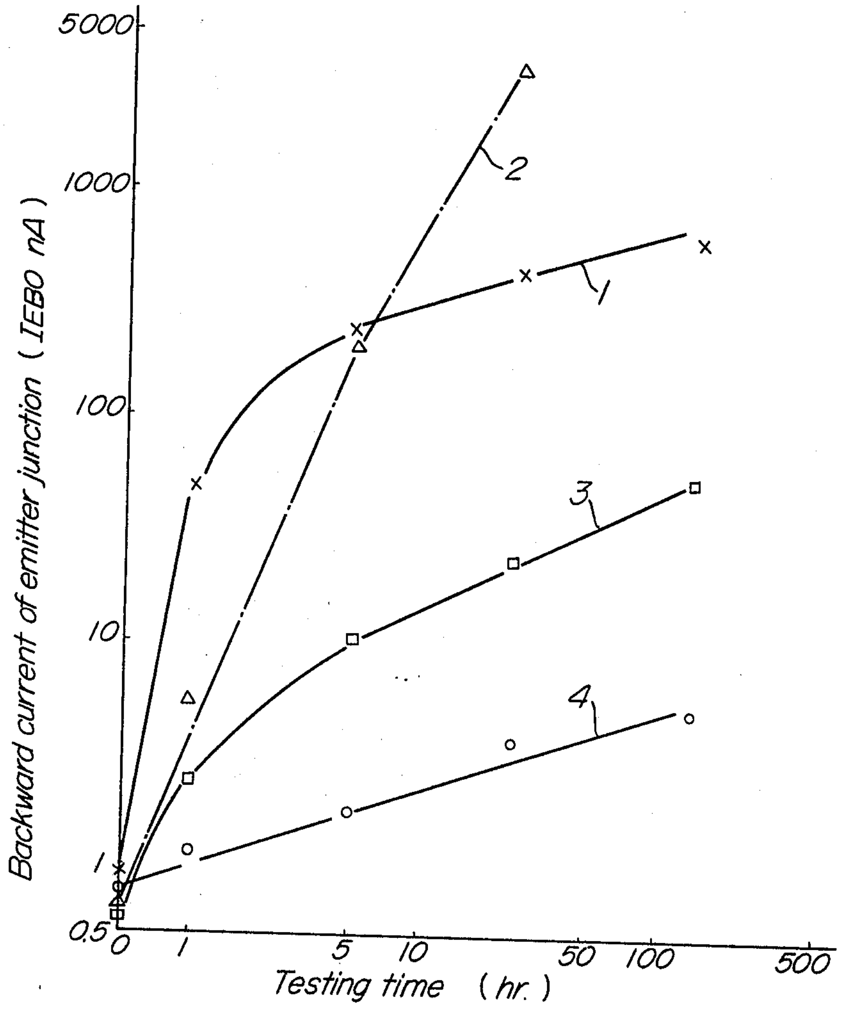

Next, description will be made on another embodiment of the invention wherein similar results were obtained by the use of different materials as the fillers. The lines in the graph of FIG. 3 represent the secular changes in the backward current $I_{EBO}$ of the P-N junctions formed between the emitter and the base regions in the transistors having resinous bodies of the composiiton of the Table 1, being group by the volumetrical percentage of filler content therein, namely line 1 representing the resinous body containing no filler; line 2 representing the resinous body containing 10% $WO_3$; line 3 representing the resinous body containing 10% $MoO_3$; and line 4 representing the resinous body containing 10% $V_2O_5$. The reading was done under the conditions, such as number of the test-transistors and the supply of electric power which were completely the same as those described in connection with FIGS. 2*a* and 2*b* where $Pb_3O_4$ was used. As is clear from this graph, the resinous body 1 containing $MoO_3$ or $V_2O_5$ imparted much superior secular change characteristics to the transistors than did the resinous body containing $WO_3$ produced no satisfactory result.

Figure 4:
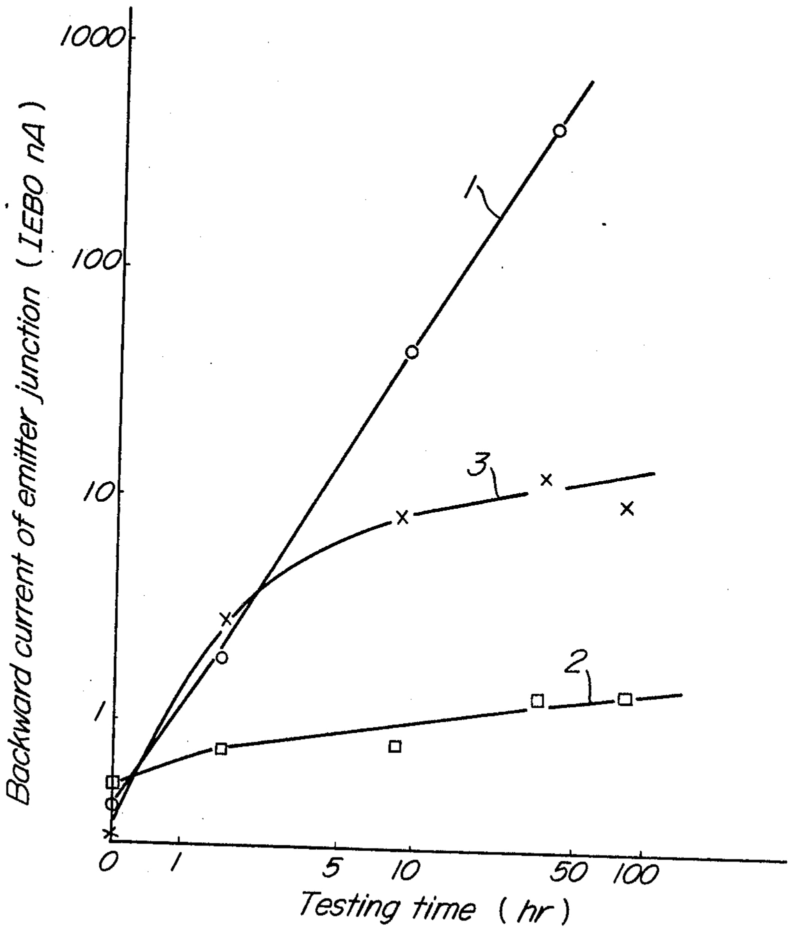

Referring now to FIG. 4, line 1 of the graph represents the secular changes of the resinous body 1 which contained $MnO_2$ of 10% by volume to that of the resinous body; line 2 represents the same wherein the resinous body contained $PbO_2$ of 10%; and line 3 represents the same wherein the resinous body comprising only the composition of the Table 1 was used. The graph of FIG. 4 shows the secular changes of the backward current of the emitter junctions of these respective resinous bodies which were read under the same conditions as those of FIG. 2 or FIG. 3. From this graph, it will be understood that where the resinous body 1 contained $PbO_2$, it imparted much superior secular change characteristics to the p-n junctions than did the resinous bodies which did not contain this material at all. As is noted from line 1, where the resinous body contained $MnO_2$, no stable characteristics were obtained.

As for the material which can be added to the resinous body 1 and which contributes to the stabilizing of the secular changes of semiconductor devices, lead oxides such as PbO other than $Pb_3O_4$, molybdenum oxides such as $MoO_2$ and $Mo_2O_3$, other than the aforesaid $MoO_3$, and vanadium oxides such as $V_2O_2$, $V_2O_3$ and $V_2O_4$, other than the aforesaid $V_2O_5$, were found to be equally useful.

Figure 6:
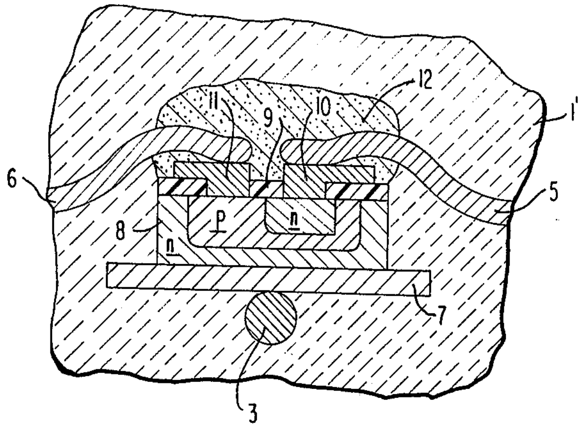
FIG. 6 is a partial sectional view of a transistor of another embodiment of this invention.

Description will now be directed to still another embodiment of the invention. In the manufacture of such elements as those shown in FIG. 6, a coating 12 containing said $Pb_3O_4$ group material was formed first on the rigid insulating dielectric layer 9 and this coating 12 was further covered with another layer 1' comprising a material such as a thermo-setting resin (which may or may not contain said $Pb_3O_4$ group material) prior to effecting the final coating with the resinous body 1 to obtain a double protective structure. A desirable characteristic similar to those shown in FIGS. 2 through 4 was obtained. This latter embodiment is useful in the coloring and shaping of the elements.

The present invention has been discussed chiefly in connection with the embodiments of FIGS. 2*a* and 2*b*, FIG. 3 and FIG. 4. It has been described that these embodiments brought forth satisfactory characteristics. The terms "satisfactory characteristics" herein used imply the long-duration stability of the elements, or in other words, a high reliability of the elements, or in still other words, the stability of the elements at the time of their operation which is obtained due to the reduced secular changes in $I_{CBO}$ and $I_{EBO}$, such as the reduced fluctuation of the current amplification factor $h_{FE}$, and also imply the increased maximum power dissipation.

The said filler which is comprised of silica is material which is used together with other material for the following purposes: to suppress the hygroscopicity and moisture permeability of the resin used; to increase the mechanical strength of the resinous bodies; to reduce the shrinkage of the resin before and after the setting of the latter; to increase the specific heat; and further to utilize its transparency so as to be free from optical defects. However, from the experiment wherein silica was substituted entirely by material of the $Pb_3O_4$ group and from the experiment wherein $Pb_3O_4$ group material was used together with silica of various volumes, it was found that in all of these cases the results obtained were all as satisfactory as were those of the previously described other embodiments. However, the use of an excessive amount of such filler and/or the $Pb_3O_4$ group material contributed to imparting fragility to the resinous body itself, and further resulted in an extremely high viscosity of the resin during the period before its setting, which in turn caused such hazard as the breaking of the connectors 5 and 6 to occur during the molding of the resinous body. Thus, it will be understood that there naturally exists a limit to the amount of these additives introduced, against the total composition, of which resin constitutes the principal component. It was found that the limit of the amount of these additives to be introduced was about 60% by volume of the total composition.

Embodiments have been discussed in the above wherein the invention was applied in various manners to transistors with the result that satisfactory secular change characteristics or reliability were obtained. It should be understood, however, that the present invention is not restricted only to these embodiments, but it can be successfully applied also to those semiconductor devices which are protected by the films comprising insulating oxides, and further applied to the semiconductor devices having p-n junctions other than transistors such as those of silicon planar diodes, with satisfactory results.

As has been described, the present invention provides a number of advantages which are all highly practicable, such as easy manufacture, low manufacturing cost, increased mechanical strength, stable operating characteristics and high reliability.

What is claimed is:

1. A semiconductor device comprising: a semiconductor substrate; a rigid protective layer of an inorganic insulating dielectric material formed on a surface of said substrate and having a thickness enough to protect the surface of said substrate from the ambient atmosphere; and resinous material covering said layer which includes at least an oxide of a metal, selected from the group consisting of lead, molybdenum and vanadium.

2. The semiconductor device according to claim 1, wherein said resinous material further includes silica.

3. The semiconductor device according to claim 1, wherein said substrate consists of monocrystalline silicon and has at least a P-N junction extending to the surface of said substrate, said dielectric layer consisting essentially of silicon oxide and protecting the entire end portion of said P-N junction extending to said surface, said resinous material comprising a mixture of epoxy resin, lead oxide and silica.

4. A semiconductor device comprising: a semiconductor substrate having at least a P-N junction extending to a surface of said substrate; a rigid protective layer of an inorganic insulating dielectric material formed on the surface of said substrate, said protective layer covering at least the entire end portion of said P-N junction extending to said surface, said protective layer having a thickness enough to protect the surface of said substrate from the ambient atmosphere; a plurality of lead wires electrically connected to said substrate; and resinous material settling said substrate and said wires into a unit, said resinous material including at least an oxide of a metal selected from the group consisting of lead, molybdenum and vanadium.

5. The semiconductor device according to claim 4, wherein said semiconductor substrate is comprised of silicon, said dielectric layer consisting essentially of silicon oxide, and said resinous material further containing silica.

6. A semiconductor device comprising: a semiconductor substrate; a rigid protective layer of an inorganic insulating dielectric material formed on a surface of said substrate and having a thickness enough to protect the surface of said substrate from the ambient atmosphere; an insulating layer covering said protective layer and containing at least one oxide of a metal selected from the group consisting of lead, molybdenum and vanadium; a plurality of lead wires electrically connected to said substrate; and resinous material settling said substrate and said wires into a unit.

7. A semiconductor device comprising: a transistor assembly including a semiconductor substrate, emitter and base electrodes disposed on a surface of said substrate, P-N junctions the end portions of which extend to the surface of said substrate, a protective layer of a rigid inorganic insulating material covering the surface of said substrate for protecting the end portion of said P-N junctions, said protective layer having a thickness enough to protect the surface of said substrate from the surroundings thereof;

collector, base and emitter leads connected with said transistor assembly; and a thermo-setting plastic body settling said transistor assembly and said leads into a unit, said thermo-setting plastic body including at least a metallic oxide selected from the group consisting of oxides of lead, molybdenum and vanadium.

8. The semiconductor device according to claim 7, in which said thermo-setting plastic body includes said metallic oxide in an amount not more than 60% of the total composition in the thermo-setting plastic body in volume ratio.

9. The semiconductor device according to claim 7, in which said semiconductor substrate is silicon and said rigid inorganic insulating layer consists substantially of silicon oxide.

10. The semiconductor device according to claim 9, in which said thermo-setting plastic body further includes silica.

11. The semiconductor device according to claim 10, in which the amount of said metallic oxide and said silica included in said plastic body is not more than 60% of the total composition in said plastic body in volume ratio.

12. The semiconductor device according to claim 7, in which said transistor assembly is an NPN type silicon transistor, said rigid inorganic insulating layer consistng essentally of silicon oxide, and said thermosetting plastic body consisting esentially of resinous material including $Pb_3O_4$.

13. A semiconductor device comprising:

a transistor assembly including a semiconductor substrate, emitter and base electrodes disposed on a surface of said substrate, PN junctions the end portions of which extend to said surface, a protective layer of a rigid inorganic insulating material covering said surface for protecting the end portions of said PN junctions, said protective layer having a thickness enough to protect the surface of said substrate from the surroundings thereof;

collector, base and emitter leads connected with said transistor assembly;

an insulating coating covering said protective layer; and a thermo-setting plastic body settling said transistor assembly and said leads into a unit;

at least one of said coating and said thermo-setting plastic body including at least a metallic oxide selected from the group consisting of oxides of lead, molybdenum and vanadium.

14. The semiconductor device according to claim 13, in which said semiconductor substrate is silicon, said rigid inorganic insulating layer consists essentially of silicon oxide, and said insulating organic coating contains $Pb_3O_4$.

15. The semiconductor device according to claim 13, wherein the amount of said metallic oxide is not more than 60% of the total composition in said organic coating and said plastic body in volume ratio.

References Cited

UNITED STATES PATENTS

| | | | |
|---|---|---|---|
| 2,758,261 | 8/1956 | Armstrong et al. | 174—52.6 |
| 2,857,560 | 10/1958 | Schnable et al. | 317—234 |
| 2,937,110 | 5/1960 | John | 317—235 |
| 3,235,937 | 2/1966 | Lanzl et al. | 317—234 |
| 2,875,384 | 2/1959 | Wallmark | 317—234 |

FOREIGN PATENTS

| | | |
|---|---|---|
| 684,322 | 4/1964 | Canada. |

JOHN W. HUCKERT, Primary Examiner

JERRY D. CRAIG, Assistant Examiner

U.S. Cl. X.R.

174—52; 317—235